US006948141B1

(12) United States Patent
Satya et al.

(10) Patent No.: US 6,948,141 B1
(45) Date of Patent: Sep. 20, 2005

(54) APPARATUS AND METHODS FOR DETERMINING CRITICAL AREA OF SEMICONDUCTOR DESIGN DATA

(75) Inventors: Akella V. S. Satya, Milpitas, CA (US); Vladimir D. Federov, Bellevue, WA (US); Li Song, Fremont, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 113 days.

(21) Appl. No.: 10/281,427

(22) Filed: Oct. 24, 2002

(Under 37 CFR 1.47)

Related U.S. Application Data

(60) Provisional application No. 60/338,348, filed on Dec. 5, 2001, and provisional application No. 60/346,074, filed on Oct. 25, 2001.

(51) Int. Cl.[7] .................................................. G06F 17/50
(52) U.S. Cl. ................................ 716/4; 716/18; 716/21
(58) Field of Search ................................. 716/4, 18, 21

(56) References Cited

U.S. PATENT DOCUMENTS

| | | | |
|---|---|---|---|
| 3,751,647 A | | 8/1973 | Maeder et al. .......... 235/151.11 |
| 5,502,306 A | | 3/1996 | Meisburger et al. ......... 250/310 |
| 5,548,211 A | | 8/1996 | Tujide et al. ............. 324/158.1 |
| 5,578,821 A | | 11/1996 | Meisberger et al. ......... 250/310 |
| 5,665,968 A | | 9/1997 | Meisburger et al. ......... 250/310 |
| 5,717,204 A | | 2/1998 | Meisburger et al. ......... 250/310 |
| 5,959,459 A | | 9/1999 | Satya et al. ................... 324/751 |
| 6,038,018 A | | 3/2000 | Yamazaki et al. ........ 356/237.1 |
| 6,044,208 A | * | 3/2000 | Papadopoulou et al. ........ 716/4 |
| 6,061,602 A | | 5/2000 | Meyer ........................... 700/83 |
| 6,061,640 A | | 5/2000 | Tanaka et al. ................. 702/81 |
| 6,066,179 A | | 5/2000 | Allan ............................. 716/4 |
| 6,091,249 A | | 7/2000 | Talbot et al. ................ 324/751 |
| 6,175,812 B1 | | 1/2001 | Boyington et al. .......... 702/118 |
| 6,178,539 B1 | * | 1/2001 | Papadopoulou et al. ........ 716/7 |

(Continued)

FOREIGN PATENT DOCUMENTS

| | | | |
|---|---|---|---|
| EP | 0853243 A2 | 7/1998 | .......... G01R/31/305 |
| EP | 092275 A2 | 1/1999 | .......... G01R/31/307 |

OTHER PUBLICATIONS

Padadopoulou et al., "Critical Area Computation vie Voronoi Diagrams", IEEE, 1999.*

(Continued)

*Primary Examiner*—Stacy A. Whitmore
*Assistant Examiner*—Brandon Bowers
(74) *Attorney, Agent, or Firm*—Beyer, Weaver & Thomas, LLP.

(57) ABSTRACT

Disclosed are mechanisms for efficiently and accurately calculating critical area. In general terms, a method of determining a critical area for a semiconductor design layout is disclosed. The critical area is utilizable to predict yield of a semiconductor device fabricated from such layout. A semiconductor design layout having a plurality of features is first provided. The features have a plurality of polygon shapes which include nonrectangular polygon shapes. Each feature shape has at least one attribute or artifact, such as a vertex or edge. A probability of fail function is calculated based on at least a distance between two feature shape attributes or artifacts. By way of example implementations, a distance between two neighboring feature edges (or vertices) or a distance between two feature edges (or vertices) of the same feature is first determined and then used to calculate the probability of fail function. In a specific aspect, the distances are first used to determine midlines between neighboring features or midlines within a same feature shape, and the midlines are then used to determine the probability of fail function. A critical area of the design layout is then determined based on the determined probability of fail function. In specific implementations, the defect type is a short type defect or an open type defect. In a preferred implementation, the features may have any suitable polygonal shape, as is typical in a design layout.

18 Claims, 9 Drawing Sheets

U.S. PATENT DOCUMENTS

| | | | |
|---|---|---|---|
| 6,210,983 B1 | | 4/2001 | Atchison et al. ............... 438/14 |
| 6,247,853 B1 | * | 6/2001 | Papadopoulou et al. ........ 716/4 |
| 6,252,412 B1 | | 6/2001 | Talbot et al. ................ 324/750 |
| 6,265,232 B1 | | 7/2001 | Simmon ...................... 438/14 |
| 6,269,326 B1 | | 7/2001 | Lejeune .......................... 703/2 |
| 6,317,859 B1 | * | 11/2001 | Papadopoulou ................ 716/4 |
| 6,324,481 B1 | * | 11/2001 | Atchison et al. ............... 702/84 |
| 6,344,750 B1 | | 2/2002 | Lo et al. ...................... 324/751 |
| 6,365,423 B1 | | 4/2002 | Heinlein et al. ............... 438/14 |
| 6,426,501 B1 | | 7/2002 | Nakagawa .................. 250/310 |
| 6,449,749 B1 | | 9/2002 | Stine .............................. 716/4 |
| 6,476,390 B1 | | 11/2002 | Murakoshi et al. .......... 250/310 |
| 6,483,334 B1 | | 11/2002 | Hsieh .......................... 324/760 |
| 6,539,272 B1 | | 3/2003 | Ono et al. ................... 700/110 |
| 6,574,760 B1 | | 6/2003 | Mydill ........................ 714/724 |
| 6,738,954 B1 | | 5/2004 | Allen et al. ...................... 716/4 |
| 2001/0016061 A1 | | 8/2001 | Shimoda et al. ............ 382/149 |

OTHER PUBLICATIONS

Wagner et al., "An Interactive VLSI CAD Tool for Yield Estimation", IEEE, 1995.*

G.A. Allan and A.J. Walton, "Efficient Critical Area Algorithms and their Application to Yield Improvement and Test Strategies", IEEE Workshop on Defect and Fault Tolerance in VLSI Systems, Montreal, Quebeck, Canada, Oct. 1994.

P.K. Nag and W. Maly, Heirachical Extraction of Critical Area for Shorts in Very Large ICs, IEEE Workshop on Defect and Fault Tolerance in VLSI Systems, Lafayette, LA, Nov. 1995.

I.A. Wagner and I. Koren, "An Interactive VLSI CAD Tool for Yield Estimation" IEE Transactions on Semiconductor Manufacturing, 8, pp 130–138, 1995.

B. El–Kareh, A. Ghatalia and A.V.S Satya, "Yield Management in Microelectronic Manufacturing", IBM Microelectronis, Semicondutor R&D Center Hopewell Junction, NY 12533, IEEE 1995.

Akella V.S. Satya, Yield Management Test Sites, IBM Corporation, East Fiskhill Facility Hopewell, Jn., NY 12533, USA, IEEE 1991 Int. Conference on Microelectronic Test Structures, vol. 4, No. 1, Mar. 1991.

Allan, G.A. and Walton, A.J., "Fast Yield Prediction for Accurate Costing of Ics", Innovative Systems in Silicon, 1996, Proceedings., Eighth Annual IEEE International Conference on Oct. 9–11, 1996, Austin, TX.

* cited by examiner

APPARATUS AND METHODS FOR DETERMINING CRITICAL AREA OF SEMICONDUCTOR DESIGN DATA

CROSS-REFERENCE TO RELATED APPLICATION

This application takes priority under U.S.C. 119(e) of (1) U.S. Provisional Application No. 60/338,348 by Akella V. S Satya and Vladmir D. Federov, filed 5 Dec. 2001, entitled "K-T CRITICAL-AREA ALGORITHMS AND SW" and (2) U.S. Provisional Application No. 60/346,074 by Akella V. S Satya et al., filed Oct. 25, 2001, entitled "FULL-FLOW INTEGRATED-IC YIELD AND RELIABILITY TEST SITE." These applications are incorporated herein by reference in their entirety for all purposes.

BACKGROUND OF THE INVENTION

This invention relates to methods and apparatus for detecting defect-densities in a semiconductor integrated circuit product and/or test structure to thereby predict product-limited yields and the product lot yields. More particularly, it relates to mechanisms for determining critical area, which is a necessary parameter for, among many purposes including prediction of the end-of-line product yield from the in-line testing and/or inspection database.

Conventionally, the test structures on a test wafer or product wafer are inspected or tested for defects, more specifically for electrical fails. The resulting defect sample may then be used to predict the yield of a product wafer lot. The test structures may be inspected using either an optical inspection tool or a scanning electron microscope. In an optical inspection, a beam of light is directed towards the test structures and the scattered light is then analyzed to determine whether defects are present within the test structures.

Another type of inspection is referred to as a voltage contrast inspection, using a scanning electron microscope. The voltage contrast technique operates on the basis that potential differences in the various conductive shapes of a sample under examination cause differences in, typically, the secondary and/or backscattered electron emission intensities when the sample is the target of a low-energy and high-current electron beam. The potential state of the scanned area is acquired as a voltage contrast image such that a low potential portion of, for example, a wiring pattern might be displayed as bright (intensity of the secondary electron emission is high) and a high potential portion might be displayed as dark (lower intensity secondary electron emission). Alternatively, the system may be configured such that a low potential portion might be displayed as dark and a high potential portion might be displayed as bright.

An electron detector is used to measure the intensity of the secondary electron emission that originates from the path swept by the scanning electron beam. Images may then be generated from these electron emissions. A defective portion can be identified from the potential state or appearance of the portion under inspection. The test structure portion under inspection is typically designed to produce a particular potential and resulting brightness level in an image during the voltage contrast inspection. Hence, when the scanned portion's potential and resulting image appearance differs significantly from the expected result, the scanned portion is classified a defect.

Several inventive test structures designed by the present assignee are disclosed in U.S. Pat. No. 6,433,561 by Akella V.S. Satya et al., issued 13 Aug. 2002, which application is incorporated herein by reference in its entirety. One test structure is designed to have alternating high and low potential conductive lines during a voltage contrast inspection. In one inspection application, the low potential lines are at ground potential, while the high potential lines are at a floating potential. However, if a line that is meant to remain floating shorts to an adjacent grounded line, both lines will then produce a low potential during a voltage contrast inspection. If there is an open defect present within a line that is designed to be coupled to ground, this open will cause a portion of the line to be left at a floating potential to thereby produce a high potential during the voltage contrast inspection. Both open and short defects cause two adjacent lines to have the same potential during the voltage inspection.

The results from inspecting the test structures, typically in a test chip, may then be used to the predict yield of a product chip that is fabricated with the same process as the test chip. Such chip yield is generally a product of the product-limited yields for all the primary defect mechanisms predicted from the corresponding test-structure yields. Each test structure yield is generally a function of the product of the defect density of the process and the critical area of such particular test structure. That is, given a particular defect is present in the test chip, the probability that the test structure will fail depends on the critical area of the test structure. Critical area refers to the fractional area of the chip-layout window, in which if a defect occurs, it would cause a fault (e.g., an electrical fail due to a short or an open). Each specific configuration of semiconductor circuit, pattern, and test structure has an associated critical area. Additionally, each specific circuit, pattern, and test structure has an associated Probability of fail curve as a function of defect size.

FIGS. 1A and 1B illustrate the concept of critical area. FIG. 1A is a diagrammatic top view of a simple test structure 100 having two conductive lines 102a and 102b. The lines 102a and 102b both have a width 104 and a spacing 106. FIG. 1B is a graph showing the critical area 103, the probability of fail 105 and the defect-size distribution 107 [normalized to unity between $X_0$ and $\infty$] as a function of defect size for the test structure 100 of FIG. 1A. A defect 110 that has a size less than the line spacing will not cause a fault (e.g., short) in any area of test structure 100. As shown in FIG. 1B, the probability of fail is zero for defects of sizes less than the line-width 106. However, a defect 108 having a size (e.g., diameter) equal to or greater than the width 106 will have an associated probability for causing a fault. For example, if the center of the defect 108 is positioned in a narrow area 109 that runs down the centerline between the two lines 102, it will cause a fault by shorting the two lines 102. The ratio of this narrow area 109 and the area of the window 100 is the probability of fail for defect 108. The probability of fail will continue to increase for increasingly sized defects until it equals unity at a particular defect size. For this test structure 100, the plateau at unity occurs at a defect size that is twice the width of the line 104 plus the spacing 106. When this probability of fail curve 105 is convoluted with the defect-size distribution 107 and the result is integrated between the limits of $X_0$ and Xmax, a reasonably large [maximum] defect size much greater than [(2*104)+(106)], the critical area may be obtained.

One conventional technique implements a closed-form solution for the probability of fail curve for the conductive line structures each having a width W, and separated by a distance S: The probability of fail is:

$$PoF\{X\} = 0 \qquad \text{for } X \leq (106)$$

$$PoF\{X\} = \frac{X-S}{W+S} \quad \text{for } (106) < X < [2*(104)+(106)], \text{ and}$$

$$PoF\{X\} = 1 \qquad \text{for } X \geq [2*(104)+(106)];$$

and the Critical Area is:

$$CA = \int_{X_0}^{X_{max}} PoF\{X\} \cdot DSD \cdot dX$$

$$= (p-1)^{(p-1)} * X_0 \left[ \int_{X_0}^{2*S+W} \left( \frac{X-S}{W+S} \right) * (1/X^p) dX + \int_{2*S+W}^{X_{max}} 1/X^p dX \right]$$

However, this closed-form solution is only valid for parallel lines of one constant width and spacing, which is neither typical in any product, nor in a usual test structure layout.

One conventional technique for determining critical area is referred to as the "Quasi-Monte Carlo simulation." In this technique, random defects are simulated as being superimposed on a particular design data. These simulated defects initially have a particular diameter x. The number of faults produced by these defects having an initial diameter x is then determined. Defects having a diameter equal to x+Δx are then simulated on the design data. The number of faults is then determined for defects having the diameter x+Δx. This simulation process iteratively repeats for larger sized defects until a maximum defect size of $X_{max}$ is reached. The probability of fail can then be determined from the number of faults and the total number of defects simulated at each incremental Δx step. This iterative process is very time consuming, even for one defect mechanism (such as opens or shorts).

In another technique, each design structure is incrementally expanded until a short fault occurs when the two structures short together. The distance that the structure expanded is equal to the radius of the defect that can cause a fault. Similarly, for the case of the opens, the shapes are contracted by Δx iteratively for determining the probability of fail curve [until $X_{max}$.] Although these techniques all succeed in determining critical area for a particular structure type, these conventional simulation techniques are each very time consuming and utilize a significant amount of processor and memory resources. Other techniques perform a simulation on "sample" portions of the design data, rather than the entire design data. One example of a critical area determination software tool is EYES developed at the University of Edinburgh, England. However, this technique may produce inaccurate determinations of the critical areas, if the simulation sampling does not include representative portions of the critical design regions of the design.

Accordingly, methodologies for more efficiently and accurately determining the critical area for a particular test structure or a product design are needed.

SUMMARY OF THE INVENTION

Accordingly, mechanisms for efficiently and accurately calculating critical area are provided. In general terms, a method of determining a critical area for a semiconductor design layout is disclosed. The critical area is utilizable to predict yield of a semiconductor device fabricated from such layout. A semiconductor design layout having a plurality of features is first provided. The features have a plurality of polygon shapes which include nonrectangular polygon shapes. Each feature shape has at least one attribute or artifact, such as a vertex or edge. A probability of fail function is calculated based on at least a distance between two feature shape attributes or artifacts. By way of example implementations, a distance between two neighboring feature edges (or vertices) or a distance between two feature edges (or vertices) of the same feature is first determined and then used to calculate the probability of fail function. In a specific aspect, the distances are first used to determine midlines between neighboring features or midlines within a same feature shape, and the midlines are then used to determine the probability of fail function. A critical area of the design layout is then determined based on the determined probability of fail function. In specific implementations, the defect type is a short type defect or an open type defect. In a preferred implementation, the features may have any suitable polygonal shape, as is typical in a design layout.

In a specific implementation, the particular defect type is a short type defect and calculating the probability of fail function includes (1) dividing the layout into a plurality of points; (2) for each point, determining a first and a second nearest features, (3) for each point, calculating a first shortest distance to the first nearest feature, (4) for each point, calculating a second shortest distance to the second nearest feature, (5) for each point, defining the second shortest distance as a critical radius; and (6) determining the probability of fail function based on the critical radius, where the probability of fail is equal to one for defects having a defect radius equal to or greater than the critical radius and is equal to zero for a defect radius less than the critical radius. A defect of such radius that falls at this point will touch both the first and second nearest neighboring shapes and cause a fault (a short in this case).

In another implementation, the particular defect type is an open type defect and calculating the probability of fail function includes (1) dividing the layout into a plurality of points; (2) for each point, determining a plurality of pairs of first and second nearest opposite edges, (3) for each point, determining one or more pairs of first and second inside opposite corners when there are one or more inside corners present within a feature associated with the each point, (4) for each point and each pair of first and second opposite edges, calculating a first shortest distance to the first nearest edge and calculating a second shortest distance to the second nearest edge, (5) for each point and each pair of inside corners, calculating a first shortest distance to the first nearest inside corner and calculating a second shortest distance to the second nearest inside corner, (4) for each point, defining a minimum of the plurality of second shortest distances as the critical radius; and (5) determining the probability of fail function based on the critical radius, where the probability of fail is equal to one for defects having a defect radius equal to or greater than the critical radius and is equal to zero for a defect radius less than the critical radius.

In yet another embodiment, calculating the probability of fail function includes the following operations: (1) for each vertex of a feature, determining and adding a midpoint of a line from such feature to a closest feature to a midpoint list; if the particular defect type is a open type defect, for each feature of the layout, determining a critical boundary midway between the longest distanced opposite edges or the inside corners of the feature (2) merging the midpoint list into a plurality of critical boundaries for shorts and for opens, called external boundaries (3) for each point of the external boundary, determining and adding a midpoint of a line from such feature to the closest feature of a different external boundary, to a midpoint list, (4) merging the midpoint list into a plurality of critical boundaries, termed internal boundaries. The intersection of the internal and external boundaries defines regions with uniform critical radius gradient. The probability of fail curve can be found from the value of the gradient function by calculating the area between the internal boundary and the external boundary.

In another embodiment, the invention pertains to a computer program product for determining a critical area for a semiconductor design layout. The computer program product has at least one computer readable medium and computer program instructions stored within the at least one computer readable product operable to perform one or more of the above described methods.

In yet another application, an inspection system for determining a critical area for a semiconductor design layout is disclosed. The system includes beam generator for generating an electron beam towards a semiconductor device or test structure and a detector for detecting secondary and/or backscattered electrons from the semiconductor device or test structure and generating a detected signal. The secondary and backscattered electrons are produced from the semiconductor or test structure in response to the generated electron beam. The system further includes a processor operable to (1) analyze a semiconductor design layout having a plurality of features, wherein the features have a plurality of polygon shapes which include nonrectangular polygon shapes; (2) calculate a probability function based on the feature shapes; (3) determine a critical area of the design layout based on the determined probability of fail function; (4) cause the beam generator and detector to direct an incident electron beam onto a plurality of test structures formed from the design layout to thereby cause the detector to generate a plurality of detected signals, the test structures being disposed on a product wafer having a plurality of semiconductor product devices; (5) determine a defect density for each test structure based on the detected signals; and (6) calculate yield of the product wafer based on the determined defect density and calculated critical area of each test structure.

In another aspect, a method for determining a critical area of at least a portion of a design layout having design shapes is disclosed. The design shapes include design shapes artifacts, such as vertices or edges. The method includes dividing the design layout into a plurality of points and for each point, determining a critical radius corresponding to at least one defect type. The determination of the critical radius is based on a plurality of distances between the each point and one or more neighboring design shape artifacts, without iteratively changing defect size or dimensions of the design shapes. In one implementation, the neighboring design shape artifacts include a vertex and an edge.

In another method aspect, a method of determining a critical area of at least a portion of a layout of a circuit pattern is disclosed. The layout has a plurality of features having a plurality of attributes. The method includes selecting two attributes from the plurality of features; determining a critical attribute of the critical area based on the selected two attributes; and based on the critical attribute, determining the critical area in a non-iterative manner.

These and other features and advantages of the present invention will be presented in more detail in the following specification of the invention and the accompanying figures, which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides efficient mechanisms for calculating the critical area, referred to as Acr(R), for a particle defect (or open defect) having a size R, based on the distances between feature attributes or artifacts, such as vertices and edges. A probability of fail curve is calculated based on one or more feature attributes or artifacts, and the critical area is then determined based on the probability of fail curve. One advantage of the several techniques of the present invention is that critical area may be determined without iteratively changing feature size or defect size. The techniques of the present invention may also be practiced on design layouts having various polygonal feature shapes, including nonrectangular shapes.

In one embodiment referred to as the critical radius approach, one may directly determine a critical radius R for several locations of a design layout. The critical radius of a particular location is generally calculated so that a defect at such location having a radius equal to or greater than the critical radius will cause a fault. A probability of fail curve may then be determined based on the critical radius, and a critical area then determined from the probability of fail curve.

In an alternative embodiment referred to as the critical boundary approach, one may determine the critical boundaries for the features within a particular layout. A critical boundary is generally defined as the midlines between the separate layout features (herein referred to as external boundaries) or the midlines between the midlines which are between the separate layout features (herein referred to as internal boundaries). The probability of fail curve may be determined from these critical boundaries, and the critical area may then be easily determined from the probability of fail curve.

Figure 2A:
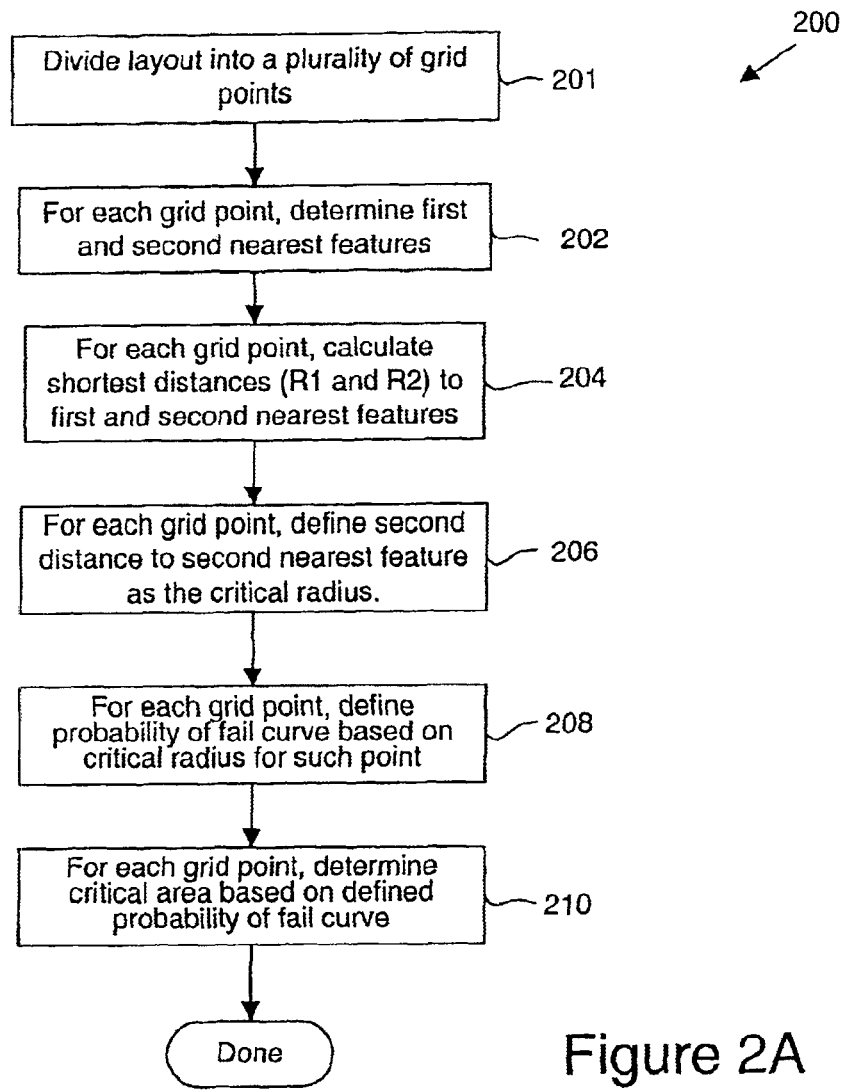
FIG. 2A is a flowchart illustrating a procedure for determining a critical area for a short type defect at a plurality of locations of a design layout in accordance with a critical radius embodiment of the present invention.
Figure 2B:
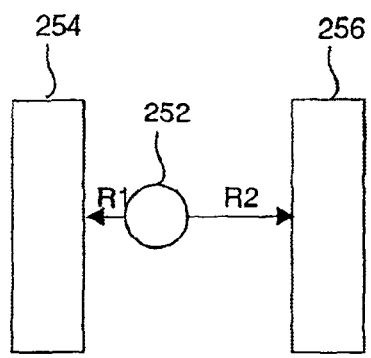
FIG. 2B is a diagrammatic representation of an example layout with which the techniques of the present invention are illustrated.

FIG. 2A is a flowchart illustrating a procedure 200 for determining a critical area for a short type defect at a plurality of locations of a design layout in accordance with a critical radius embodiment of the present invention. FIG. 2B is a diagrammatic representation of an example layout with which the techniques of the present invention are illustrated. Initially, the design layout is conceptually divided into a plurality of grid points in operation 201. The distance between the grid points is usually much smaller than the minimum feature of a layout. For each grid point, a first and second nearest feature is then determined in operation 202. Because there are less polygon vertices than the grid points in a design layout, the search for the nearest neighboring shapes may be done by recording the distance of all the grid points that are close to each vertex and each edge. Each grid point keeps track of two smallest distances. After all the polygon vertices and edges are looked at, the two smallest distances of each grid point are then the distances to the first and the second nearest neighbor. In the example of FIG. 2B, the grid point 252 has a first nearest feature 254 and a second nearest feature 256.

Referring back to FIGS. 2A and 2B, a first shortest distance R1 from the grid point 252 to the first nearest feature 254 is calculated and a second shortest distance R2 from the grid point 252 to the second nearest feature 256 is calculated in operation 204. For each grid point, the critical radius may then be defined as the second shortest distance R2 in operation 206. A probability function or curve may then be defined for each grid point based on the determined critical radius in operation 208. For example, the radius of a short or open type defect at a specific position is smaller than the critical radius at the position, then the kill or failure probability of this defect is zero. If the radius of the defect is larger, then the kill probability is one. The critical area may then be determined based on the kill probability of the defects at a plurality of positions on the chip area and the defect size distribution (obtained from one or more test structures) in operation 210. That is, the probability of fail curve is convoluted with the defect size distribution curve, and an integration is taken of the resulting curve to obtain the critical area (e.g., as illustrated in FIG. 1B). The procedure for determining the critical area then ends.

If a defect with a radius equal to the second nearest feature distance R2 were to fall on this grid point 252, then the defect would touch both features 254 and 256 and cause a short. Thus, the distance to the second nearest feature R2 is the critical radius for grid point 252.

Figure 3A:
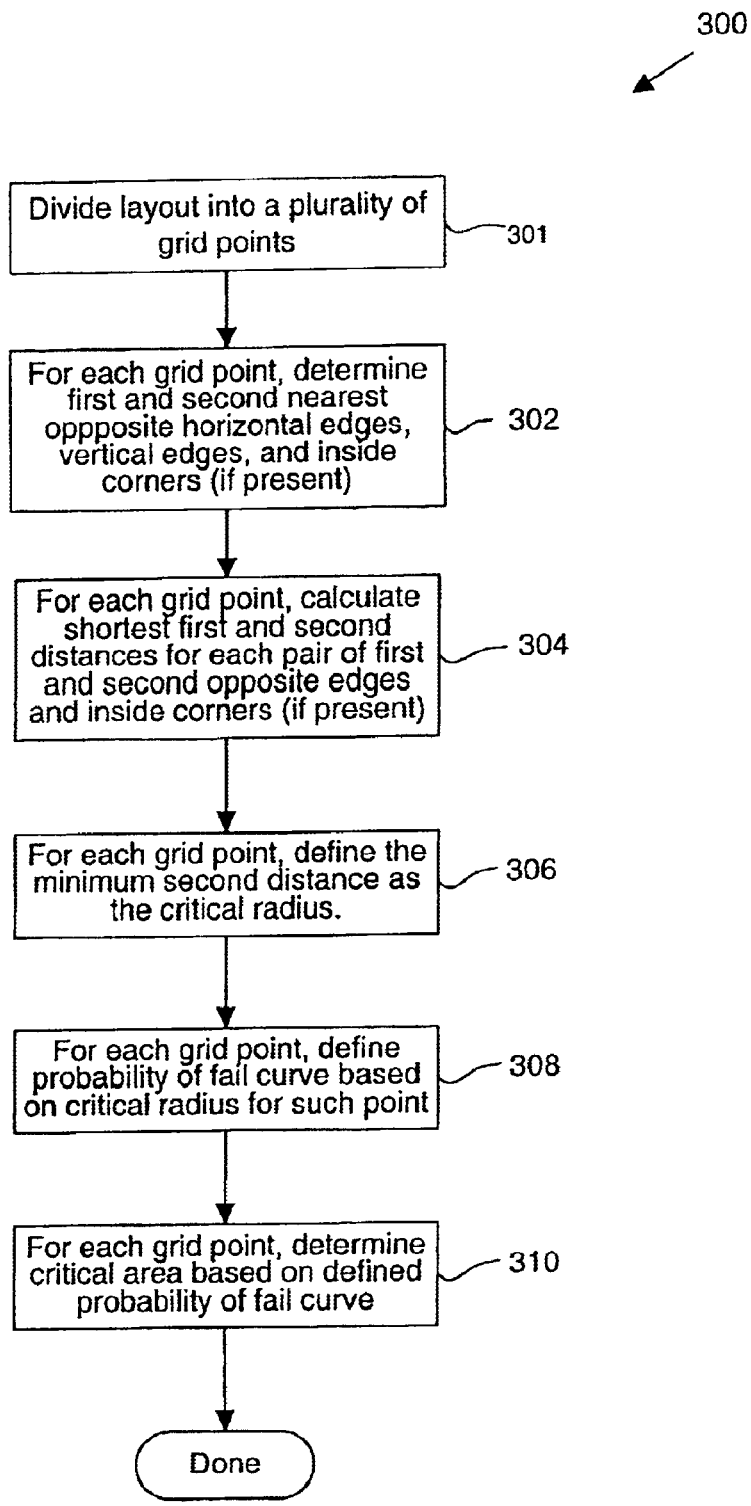
FIG. 3A is a flowchart illustrating a procedure for determining a critical area for an open type defect at a plurality of locations of a design layout in accordance with a critical radius embodiment.
Figure 3B:
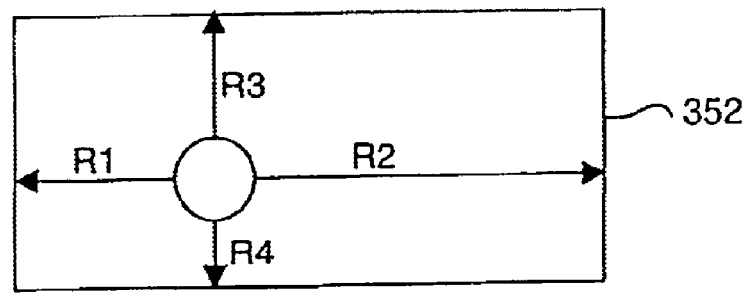
FIGS. 3B and 3C are diagrammatic representations of a first example layout of a rectangular feature and a cross-shaped feature, respectively, with which the techniques of the present invention are illustrated.
Figure 3C:
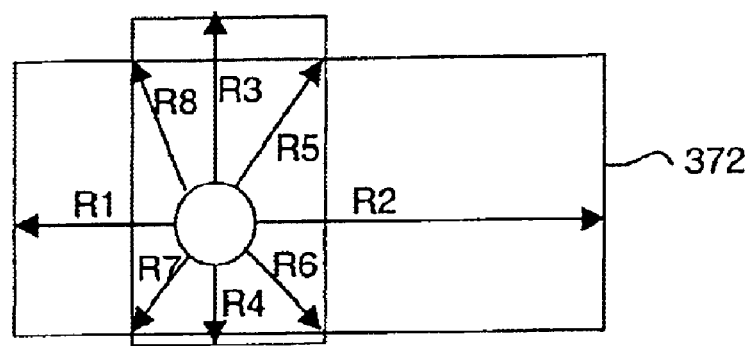

When a defect passes through two horizontal (or vertical) edges or appropriately defined corners of a feature, an open type defect occurs. FIG. 3A is a flowchart illustrating a procedure 300 for determining a critical radius for an open type defect at a plurality of locations of a design layout. FIGS. 3B and 3C are diagrammatic representations of a first example layout of a rectangular feature 352 and a cross-shaped feature 372, respectively, with which the techniques of the present invention are illustrated.

Initially, the design layout is conceptually divided into a plurality of grid points in operation 301. The first and second nearest opposite horizontal edges, vertical edges, and inside corners (if present) are determined for each grid point in operation 302. The shortest distance from each grid point to each opposite edge or inside corner is then calculated in operation 304. For the rectangular feature 352 of FIG. 3B, a first shortest distance R1 and a second shortest distance R2 are calculated for the opposite vertical edges. A first shortest distance R4 and a second shortest distance R3 are also calculated for the opposite horizontal edges. Of course, this technique may easily be applied to non-rectangular shaped polygons. That is, a first and second distance may be calculated for any number of edges, besides horizontal and vertical edges. Since the rectangular feature 352 does not have any inside corners, a first and second shortest distance is not calculated for any opposite inside corners.

For the cross-shaped feature 372 of FIG. 3C, a first shortest distance equal to R1 and a second shortest distance equal to R2 are calculated for the opposite vertical edges. A first shortest distance equal to R4 and a second shortest distance equal to R3 are also calculated for the opposite horizontal edges. Since the rectangular feature 372 does have inside corners, a pair of first and second shortest distances are calculated for each pair of opposite inside corners. As shown, a first shortest distance R7 and a second shortest distance R5 are calculated for a first pair of opposite inside corners, and a first shortest distance R6 and a second shortest distance R8 are calculated for a second pair of opposite inside corners. If a particular inside corner were to not have an opposite inside corner, of course, only a single shortest distance would be calculated for each single inside corner.

After the first and second distances are calculated for each edge or corner pair, the minimum second distance is defined as the critical radius in operation 306. For the rectangular feature 352 of FIG. 3B, the second shortest distance R3 is defined as the critical radius because it is shorter than the only other second shortest distance R2. For the cross-shaped feature 372 of FIG. 3C, the second shortest distance R8 is defined as the critical radius because it is shorter than the other second shortest distances R2, R3, and R5.

A probability function or curve may then be defined for each grid point based on the determined critical radius in operation 308. The critical area may then be determined based on the kill probability of the defects at a plurality of positions on the chip area and the defect size distribution (obtained from one or more test structures) in operation 310.

Figure 4A:
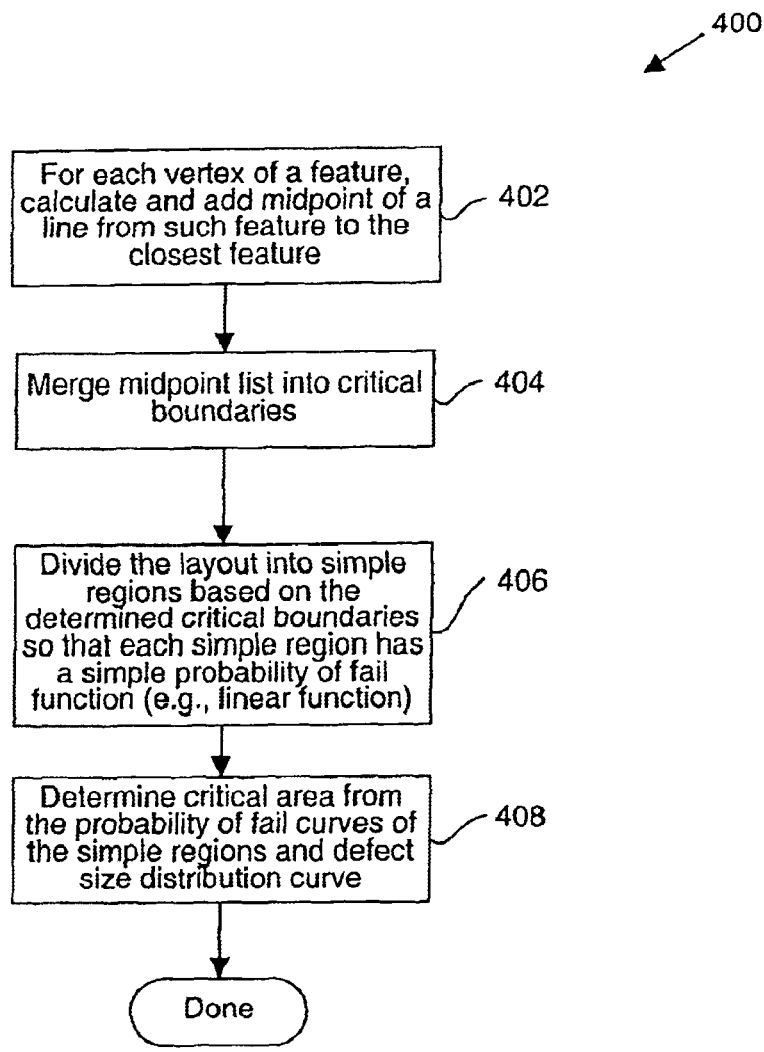
FIG. 4A is a flowchart illustrating a procedure for determining a critical area for a short type defect at a plurality of locations of a design layout based on a critical boundaries determination in accordance with a critical boundary embodiment of the present invention.

Another technique for determining the critical area of a particular layout includes first determining the critical boundaries for such layout. FIG. 4A is a flowchart illustrating a procedure 400 for determining the critical area for a short type defect at a plurality of locations of a design layout based on a critical boundaries determination in accordance with an alternative embodiment of the present invention. Initially, the design layout is conceptually divided into a plurality of grid points in operation 401. For each vertex of each feature of the design layout, a midpoint of a conceptual line between a vertex and a nearest feature is determined and added to a midpoint list in operation 402.

Figure 4B:
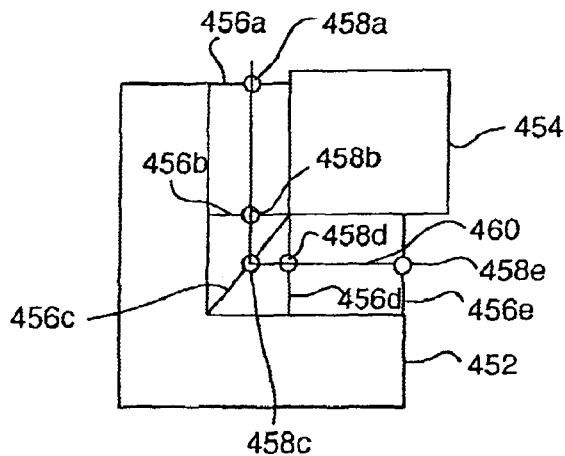
FIG. 4B is a diagrammatic representation of a layout having two features for which a list of midpoints are determined.

FIG. 4B is a diagrammatic representation of a layout having two features for which a list of midpoints 458 are determined. As shown, the layout includes a first feature 452 and a second feature 454. For a single vertex of the first feature 454, midpoints 458b–d which lies halfway along line 456b–d, respectively, between the vertex of the first feature 454 and the second feature 452 are determined. For the vertices of feature 452, a midpoint 458a which lies along line 456a between a vertex of feature 452 and feature 454 and a midpoint 458e which lies along line 456e between a vertex of feature 452 and feature 454 are determined.

Figure 5:
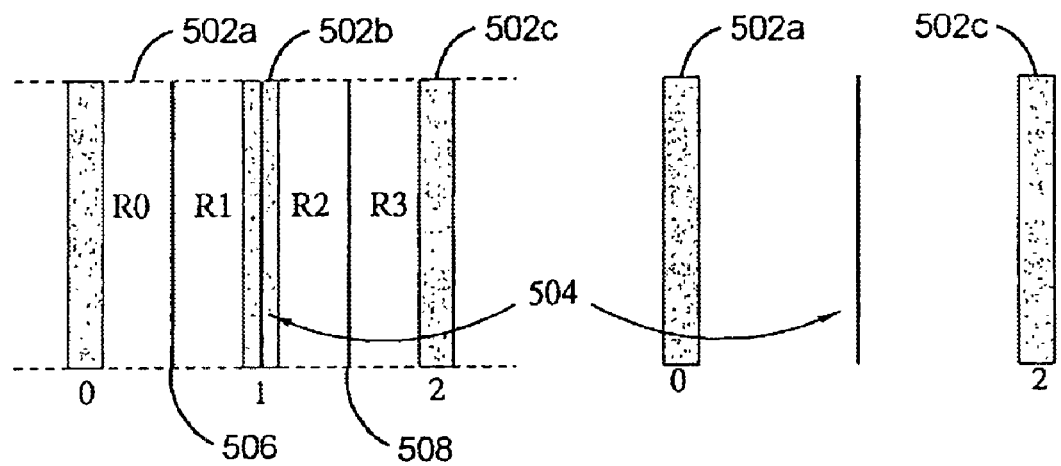
FIG. 5 illustrates examples of both internal and external boundaries.

Referring back to FIG. 4A, after the midpoints of each feature vertex are determined, the midpoint list is then merged into critical boundaries in operation 404. As shown in FIG. 4B, critical boundary 460 is formed from merged midpoints 458a–e. After the critical boundaries of a layout are determined, the layout is then divided into simple regions based on the determined critical boundaries so that each simple region has a simple probability function, such as a linear function, in operation 406. FIG. 5 illustrates a layout divided into simple regions based on internal and external boundaries. As shown, the layout is divided into regions R0, R1, R2, and R3. The internal and external boundaries form such regions. As shown, internal boundary 502b and external boundary 508 form edges of simple region R2. The probability curve for region R0, for example, is [(X–Xo)/area of R0], where X0 is coordinate 502b. The total probability of fail curve can then be obtained by summing all of the probability of fail curves for the individual simple regions, weighted by the area of these regions.

The critical area may then be determined from the probability of fail curve and the defect size distribution curve in operation 408. That is, the probability of fail curve is convoluted with the defect size distribution curve, and an integration is taken of the resulting curve to obtain the critical area (e.g., as illustrated in FIG. 1B).

Figure 4C:
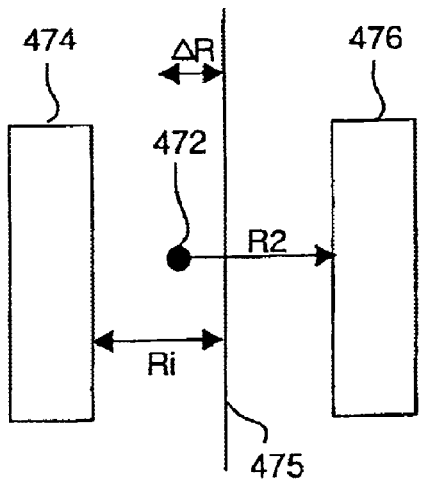
FIG. 4C illustrates a probability of fail function's critical radius for an example simple region for a short type defect.

FIG. 4C illustrates a probability of fail function's critical radius for an example simple region for a short type defect. As shown, a critical boundary 475 has been determined midway between a first feature 474 and a second feature 476. Therefore, a critical radius may be determined, for example, for grid point 472 based on such critical boundary 475. A minimum distance Ri from the critical boundary 475 to the feature 474 is determined. Alternatively, a minimum distance from the critical boundary 475 to the feature 476 may be determined. A minimum distance $\Delta R$ from the grid point 472 and the critical boundary 475 is also determined. The critical radius R2 is then equal to Ri+$\Delta R$.

Figure 4D:
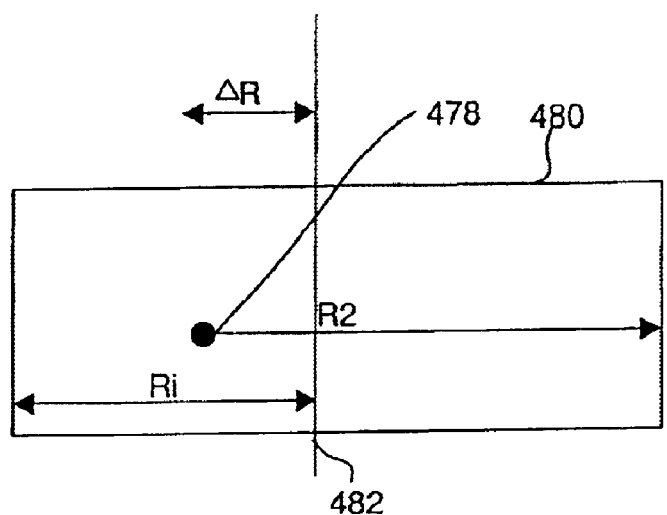
FIG. 4D illustrates a probability of fail function's critical radius for an example simple region for an open type defect.

The critical boundary technique for determining critical radius may be slightly modified to determine the critical radius of an open type defect. FIG. 4D illustrates a probability of fail function's critical radius for an example simple region for an open type defect. As shown, for the feature 480 associated with grid point 478 a critical boundary 482 has been determined midway between the longest opposite edges or inside corners of feature 480. A critical radius may then be determined, for example, for grid point 478 based on such critical boundary 482. A minimum distance Ri from the critical boundary 482 to a feature edge is calculated. A minimum distance $\Delta R$ from the grid point 478 to the critical boundary 482 is also calculated. The critical radius R2 is then defined as Ri+$\Delta R$.

Although the following procedures are described mostly in terms of calculating a critical area for short type defects, of course, these procedures may easily be modified for open type defects. Additionally, although these techniques are described in terms of rectangular shaped structures, these techniques may easily be applied to any suitable polygon shapes.

Figure 1A:
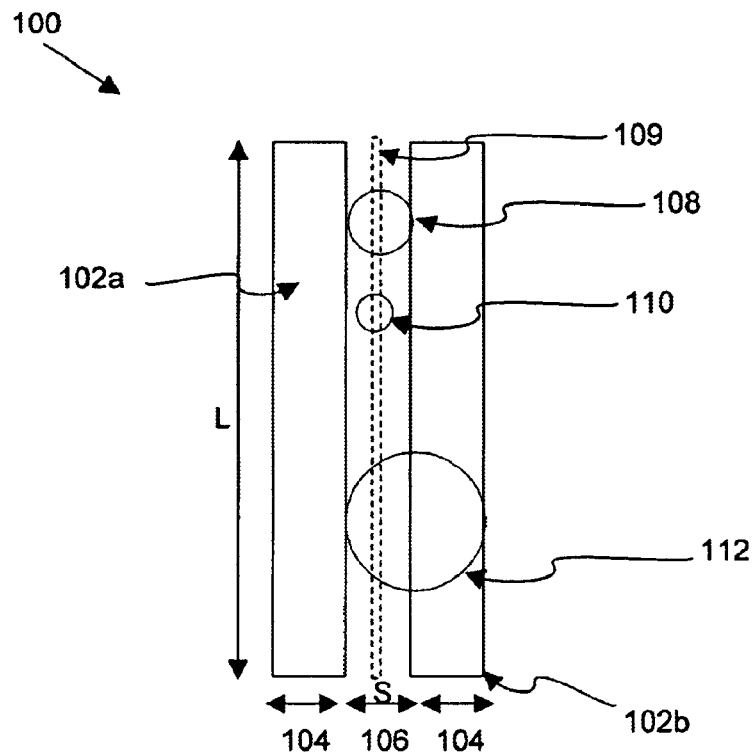
FIG. 1A is a diagrammatic top view of a simple test structure having two conductive lines.
Figure 1B:
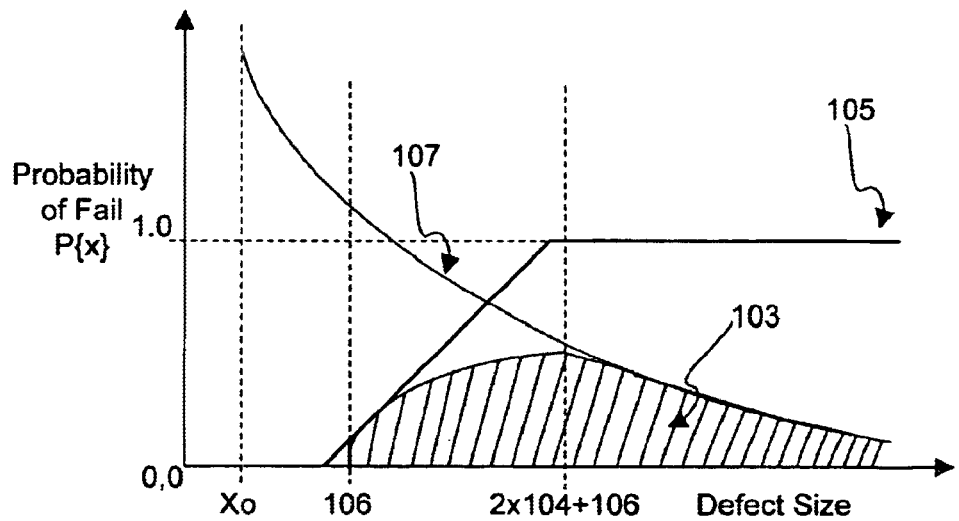
FIG. 1B is a graph of the Probability of Fail, the Defect Size Distribution function, and the critical area as a function of defect size for the test structure of FIG. 1A.

To further illustrate techniques for determining probability of fail and critical area for a layout, the simple layout example of FIG. 1A will now be examined more closely. This example includes two parallel metal lines of length L, separated by a narrow slit of width S. If we assume that the defect falls between the metal lines, we can make a few observations. A defect with radius smaller than S/2 most likely will not cause a short regardless of where it falls. The smallest defect that may likely cause a fault falls in between the two metal lines and has a radius of about S/2. A defect with radius of S/2+$\Delta$ falls into within $\pm\Delta$ of the median line in order to touch both lines. Then the Probability of Fail (PoF) can be defined as:

$$PoF(R) = \begin{cases} 0 & \text{for } 0 \leq R < S/2 \\ \frac{2L(R - S/2)}{\text{Area}} & \text{for } S/2 \leq R \leq W + S/2 \end{cases}$$

The observations above may then be generalized for more complex system. Consider the smallest particle that can fall at a given point, p, and cause a fault. That particle typically touches at least two polygons and the radius of the particle equals the distance, $D_{far}$, to the second closest polygon. If the radius were smaller than $D_{far}$, the particle would no longer cause a fault. Let us define the critical radius, Rcr(p), as the radius of the smallest particle that would cause a fault if it falls at point p.

Since the distance to a polygon with axis parallel edges can be measured to a vertical edge, horizontal edge or a vertex, the critical radius may be in one of the following forms:

$$R_{cr}(p, p_0) = \begin{cases} \pm(p_0 \cdot x - p \cdot x) & \text{for vertical edges,} \\ \pm(p_0 \cdot y - p \cdot y) & \text{for horizontal edges,} \\ \sqrt{(p_0 \cdot y - y)^2 + (p_0 x - x)^2} & \text{for vertices.} \end{cases}$$

Although the axis parallel edges were chosen in the above example, these techniques may be trivially generalized to arbitrarily linear or parabolic edges. For the simple example of FIG. 1A, let p fall on the median line; then:

$$R_{cr}(p, p_0) = \begin{cases} p_0 \cdot x - p \cdot x + S/2 & \text{for } x \leq x_m, \\ p \cdot x - p_0 \cdot x + S/2 & \text{for } x \geq x_m. \end{cases}$$

In general critical radius can be defined by function Rcr(p; $p_0$; type), where $p_0$ is the vertex/edge to which the distance is measured and type is the type of the function used to measure distance. Then, consider a region $R_1$ such that for all points p inside the region $p_0$ and type do not change. Such regions are referred to herein as "simple regions." For example, the original example has two simple regions: R1 for $x \leq x_m$, $0 \leq y \leq L$ and $R_2$ for $x \geq x_m$, $0 \leq y \leq L$. In $R_1$, the critical radius is measured to the polygon on the right $x_m - x + S/2$; while in $R_2$, the critical radius is measured to the island on the left $x - x_m + S/2$. The process for analytically calculating Acr(R) for a simple region is described further below. The process generally involves breaking simple regions down into rectangular, triangular, and parabolic sub-regions and applying pre-calculated solutions. For both regions in FIG. 1A, the Probability of Fail obtained using this method is:

$$PoF(R) = \begin{cases} 0 & \text{for } 0 \leq R \leq S/2 \\ \frac{L(R-S/2)}{\text{Area}} & \text{for } S/2 \leq R \leq W + S/2, \\ 1 & \text{for } R \geq W + S/2 \end{cases}$$

The evaluation can be accomplished in O(n) time, where n is the number of edges of the simple region and O is the order of time. e.g. the increase of time of evaluating the Probability of Fail scales linear with the number of edges. If the whole layout is subdivided into simple regions (FIG. 5), then the PoF(R) of the whole layout equals the sum of the PoF(R) of simple regions.

$$TotalArea * PoF(R) = \sum_{i=1}^{n} SimpleRegionArea * PoF(R)_i$$

FIG. 5 illustrates examples of both internal and external boundaries. The boundaries sub-divide the layout into regions R0;R1;R2;R3. An external boundary is generally defined as the mid-plane or midline that separates two adjacent features, and an internal boundary is generally defined as the mid-plane or midline that separates external boundaries. These particular regions happen to be simple regions, but in general that is not true. The regions created by combination of internal and external boundaries may contain a change in the formula type and/or $p_0$ of Rcr(p; $p_0$; type), but $p_0$ is vertex of the same polygon for all p inside the region.

The Probability of Fail may be determined by the following procedure:
I. Calculate the Voronoi diagram—external boundary for all polygons.
II. Re-calculate the Voronoi diagram of the neighbors of a polygon, P, without Pi—internal boundary for all polygons.
III. Subdivide the semi-simple regions formed by the combination of internal and external boundary into simple regions.
IV. Calculate the Probability of Fail of the simple regions.

Step I takes O(n log n), where n is the number of edges, while Step II takes O(nB logB), where B is the average number of edges of the neighboring polygons. Since B logB<<log n for large layouts, the first two steps are O(n log n). Steps III and IV are linear in the number of vertices and since the number of Voronoi vertices is linear in the number of sites(edges), we have O(n) for Steps III and IV. Overall the procedure runs in O(n log n) time with the number of edges.

While efficiency of calculating the critical area for the set of polygons is important, it takes unreasonably long to process a layout without taking advantage of its hierarchical nature. Normally a large structure is constructed of repeating cells, for example an N-bit comparator is constructed of N one-bit comparators. A one-bit comparator may be broken into more cells, while the N-bit comparator may be used multiple times in a larger cell, such as a divider. If the whole layout is represented as a set of polygons, much effort is wasted calculating internal and external boundaries for the same design cells. On the other hand, starting at the smallest cell, such as, an AND-gate is not beneficial, because at a level of a few polygons entire external/internal boundaries may be dependent on the polygons surrounding the cell.

Preferably, one starts at the smallest cell and continues "smashing" the layout until the number of polygons reaches a preset limit. Smashing or flattening is the action of removing the hierarchical information. However, sometimes a move one level up may result in a huge increase in the number of polygons. For example, moving from a memory cell to the whole memory array is usually not advantageous. The exact algorithm for deciding which cells need to be smashed also depends on the file format and the storage constraints. A completely flattened design can easily require a few terabytes of storage.

Figure 6:
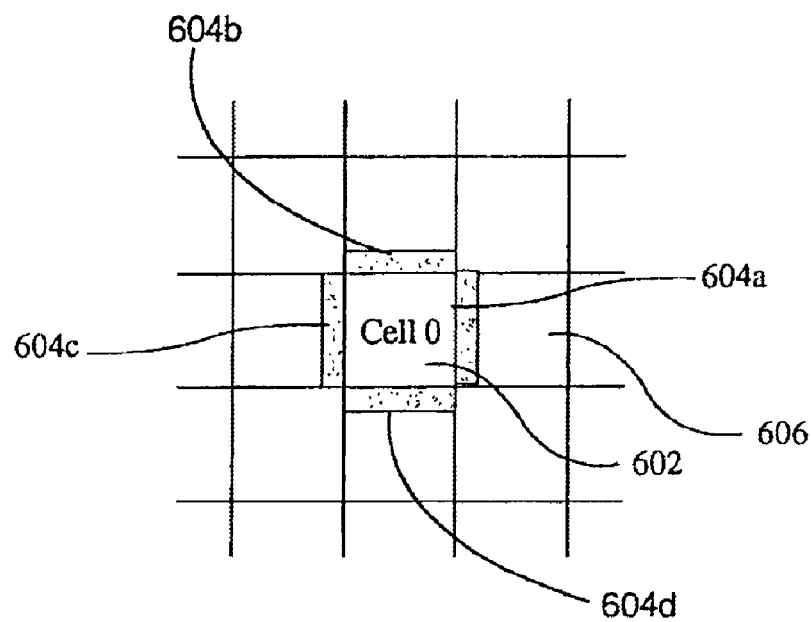
FIG. 6 is a diagrammatic representation of bounding polygons.

The internal boundary of the polygons, that have a point in their external boundary that is closest to the bounding rectangle (see FIG. 6), is dependent on the surrounding polygons. All the calculations that involve these internal boundaries may be repeated every time the surrounding changes, while the rest need only be done once. In order for the internal boundaries to be calculated, the following information is preferably stored: the polygons with undefined internal boundary, their external boundary, and their neighboring polygons. Given a cell, we can compute exactly how much of it is independent of the surrounding polygons and decide on whether it should be stored.

Yield enhancement at the design level is concerned with tweaking the layout to obtain the optimal yield for a given process. The changes made to the layout may ideally improve the yield without affecting performance or layout area. These remaining sections are concerned with using the information derived from the geometry of the layout to determine the optimal set of changes. It has been shown that the statistical models and the relationship between global and local deformation can be expressed in closed form.

Throughout the remaining sections, it is assumed that the appropriate defect-distribution function D(R) has already been defined. Further, it is assumed that different definitions of this function will be used for different areas of the layout to take into account edge of wafer effects, clustering, and so on. The emphasis of the remaining section is on the derivation of the instantaneously optimal local change from the local geometry. To this end, techniques similar to those described above for calculation of the Probability of Fail in closed form are used.

An objective function for random defects is defined as, $$\Phi(\text{Layout}) = \sum_{i=1}^{n} \text{weight}_i \int_{R_{\min}}^{R_{\max}} PoF_i(R) D_i(R) dR,$$

where $PoF_1(R)$=Probability of Fail, and $Di(R)$=the defect size distribution function. The methods for calculating Acr (R) for shorts and opens, are given above. Using the data on the defect size distribution from test structures, $Di(R)$ can be defined. The optimal values for weight cannot be determined from the geometry of the layout as they are dependent on the process parameters and the type of circuit being manufactured. We will assume all faults to be of equal weight and increase in the expected number of one type of defect combined with a more significant decrease in the expected number of another type of defect to always be beneficial. Given both $Di(R)$ and $PoF(R)$ for each defect type and assuming weight=1, we can calculate $\Phi(\text{Layout})$. Lets define the optimal instantaneous change as the change that causes the maximum decrease in $\Phi(\text{Layout})$.

The traditional approach to yield enhancement involves a pre-defined set of changes that can be applied to layout. The changes judged to be beneficial on the basis of an approximation of Probability of Fail or some other heuristic may be applied sequentially. Here is a simple set of example layout changes:

Line displacement
increased contact size or number of contacts
increased contact overlap
increased line width Each of the above change types is usually confined to a predefined form; e.g., line displacement may be expressed as a horizontal or a vertical shift. A better approach is to determine the instantaneously optimal change to layout with respect to each defect. For example, consider a set of polygons, Sp, describing a layout. It is more informative to find the direction of movement for each polygon that minimizes the probability of a short than to decide for each polygon whether a vertical shift is more beneficial than no shift. In order to calculate the instantaneously optimal change, the derivative of the expected number of defects is determined with respect to the layout change type.

The procedure optimization software may be implemented using local gradient descent on the optimal displacement vector and shape-resizing vector to find the local minimum.

Figure 7:
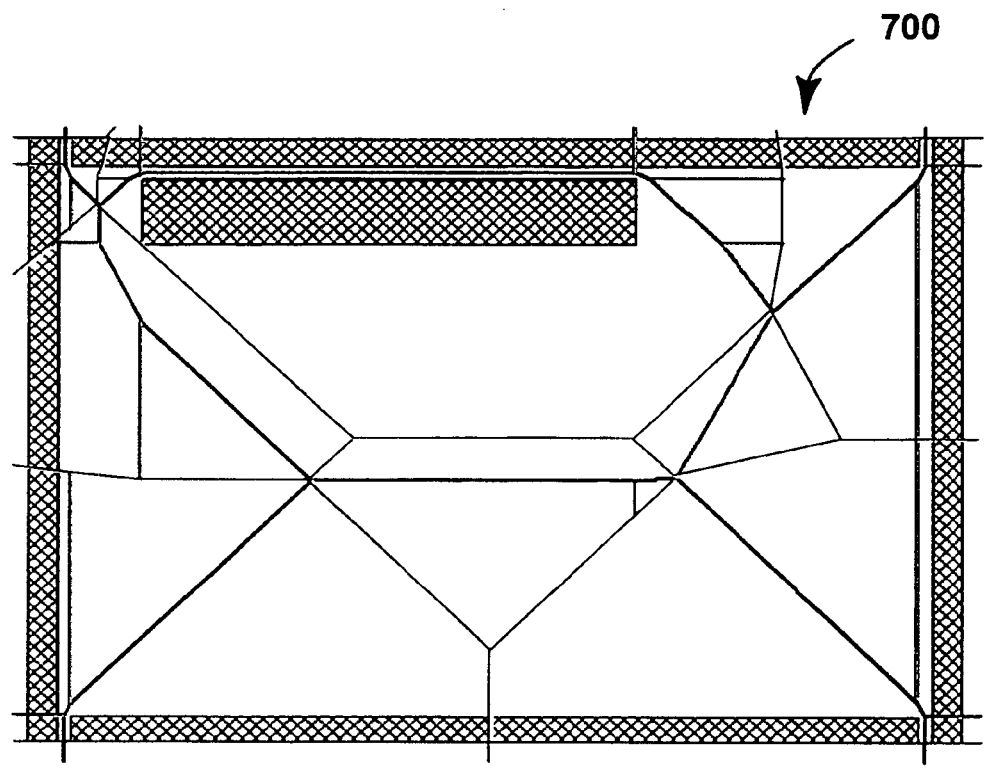
FIG. 7 is a diagrammatic representation of an initial state of a layout example implementing techniques of the present invention.
Figure 8:
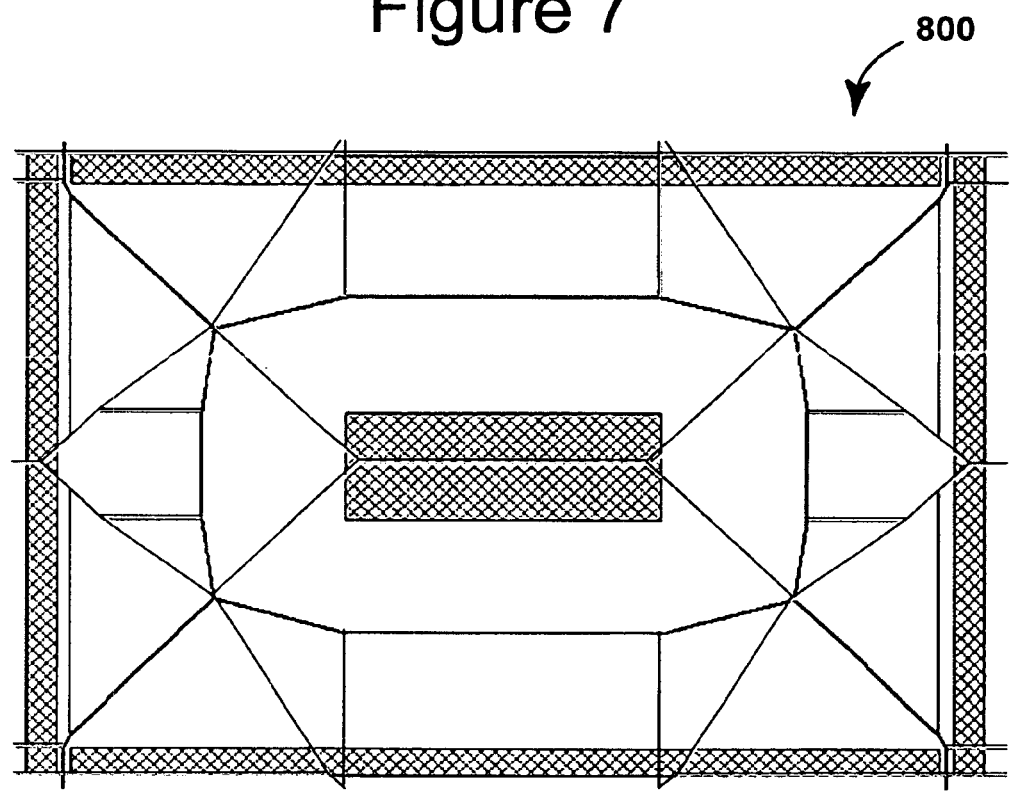
FIG. 8 is a diagrammatic representation of a final state of a layout example implementing techniques of the present invention.

Using the techniques described herein, the geometry of the layout can be optimized to achieve a local minimum in the expected number of faults. FIGS. 7 and 8 show a simple layout containing a single movable metal line surrounded by fixed lines being optimized for shorts under fixed area constrained. The mobile line moves to the middle of the empty space and re-sizes itself to resemble the shape of the empty space. Each calculation of the optimal change takes O(n log n), so the whole optimization can be done in O(Snlog n), where S is the number of steps required to achieve the local minimum or the given objective.

The decrease in critical area and $\Phi(\text{Layout})$ due to the optimization largely depends on how close is the input to a local minimum. While it is impossible to guarantee an improvement of ten or twenty percent, the optimization will always result in only positive consequences.

When the desired Probability of Fail curve of a particular product chip has been calculated for a set of provided test structures, the yield of the corresponding product chip may the be predicted using the sampled defect results from the provided test structure. Yield is calculated in any suitable manner based on each test structure. In one embodiment, yield for a defect type j on layer i in a particular test structure is calculated using the following equation:

$$Y_{ij} = \frac{1 - \text{Number of failing cells}}{\text{Total number of unit cells}}$$

The total yield for the product chip is then calculated by combining the yield for the different test structures. The following equation shows the relationship between the total yield and the yield for each of seven substructures S1 through S2:

$$\ln(Y_{total}) = \ln(Y_{S1}) + \ln(Y_{S2}) + \ln(Y_{S3}) + \ln(Y_{S4}) + \ln(Y_{S5}) + \ln(Y_{S6}) + \ln(Y_{S7})$$

Preferably, some of the test structures have characteristics that affect random yield, while other test structures have characteristics that affect systematic yield. Total yield is affected by a number of parameters. The equation for yield is shown below:

$$Y_{ij} = Y_{0ij} e^{-D_{0ij} \int_{0}^{\infty} PoF(r) DSD_{ij}(r) dr}$$

where $D_{oij}$ equals the total number of defects for defect type y on layer i per unit area (e.g., unit cell), $Y_{oij}$ equals $1-Y_{sij}$, where $Y_{sij}$ is the systematic yield loss for defect type j on layer i, $PoF_{ij}(r)$ is the Probability of Fail of defect type j on layer i, and $DSD(r)$ equals the defect size distribution of defect type j on layer i. The parameter $D_{oij}$ is the random defect density, and $Y_{oij}$ is referred to as the systematic-defect-limited-yield component. Accordingly, each test structure may be designed to include characteristics that affect either of these two parameters. Several illustrative test structures for predicting random type yield are described in U.S. Pat. No. 6,433,561 by Akella V.S. Satya et al., issued 13 Aug. 2002 and co-pending U.S. patent application Ser. No. 09/991,188, by Weiner et al., filed 14 Nov. 2001, which patent and application are incorporated herein by reference in their entirety. Other types of test structures work better for systematic type yield prediction (process margin or pattern related failures), and such test structure types are well known to those skilled in the art. By way of example, pairs of adjacent short and long conductive lines may be used as the unit cell, which has a higher probability of failures than a pair of equally long conductive lines (such as those illustrated in FIG. 1A) configured at the same design rules. By way of another example, each cell may include a straight line and a bent line. In another example, each cell may have a different via density. Finally, a cell may include a long line over a via and a short line over a via.

A test chip may be designed to include test structure having different types of test structures that work well for predicting different types of systematic or random yield predictions. For example, the test chip may include test structures that may be selectively sampled to mimic a particular critical area and test structures that mimic systematic attributes that affect systematic yield. For random yield prediction, the above described techniques may be used. For systematic yield prediction, the same number and type of patterns may be sampled from the different systematic test structures as occur on a particular product chip that adversely affect systematic yield. Thus, yield may be accurately predicted for the particular product chip since the sampled test patterns may be selected to correspond to the patterns on the particular product chip that contribute to both the systematic and random yield components of the yield equation shown above. The yield from the random type substructures is then combined with the yield from the systematic type substructure to obtain the total yield of the product chip (i.e., random yield×systematic yield).

The above critical area determination techniques may be applied to other applications, besides predicting yield for an existing product chip design. For instance, the test chip may be used to assess the feasibility of a proposed product chip design before it is implemented. Additionally, a separate test chip does not have to be designed for each product design since the same test chip may be sampled differently to obtain different yield predictions for different product designs. The yield results from the test chip may then be fed back to the product designers (including fabless foundries) so that they can design a more robust product chip that is less likely to fail. In other words, the designers will now know which designs will likely have the highest yield by using a single test chip across multiple designs. Additionally, the test chip may be used to determine which types of patterns result in the highest yield. Other patterns that result in lower yield may then be avoided in the product chip.

Generally, the techniques of the present invention for determining critical area may be implemented on software and/or hardware. For example, these techniques can be implemented in an operating system kernel, in a separate user process, in a library package bound into inspection applications, or on a specially constructed machine, such as an optical or scanning electron microscopy inspection system available from KLA-Tencor of San Jose, Calif. In a specific embodiment of this invention, some of the techniques of the present invention are implemented in software such as an operating system or in an application running on an operating system. A software or software/hardware hybrid critical area determination system of this invention may be implemented on a general-purpose programmable machine selectively activated or reconfigured by a computer program stored in memory.

Figure 9:
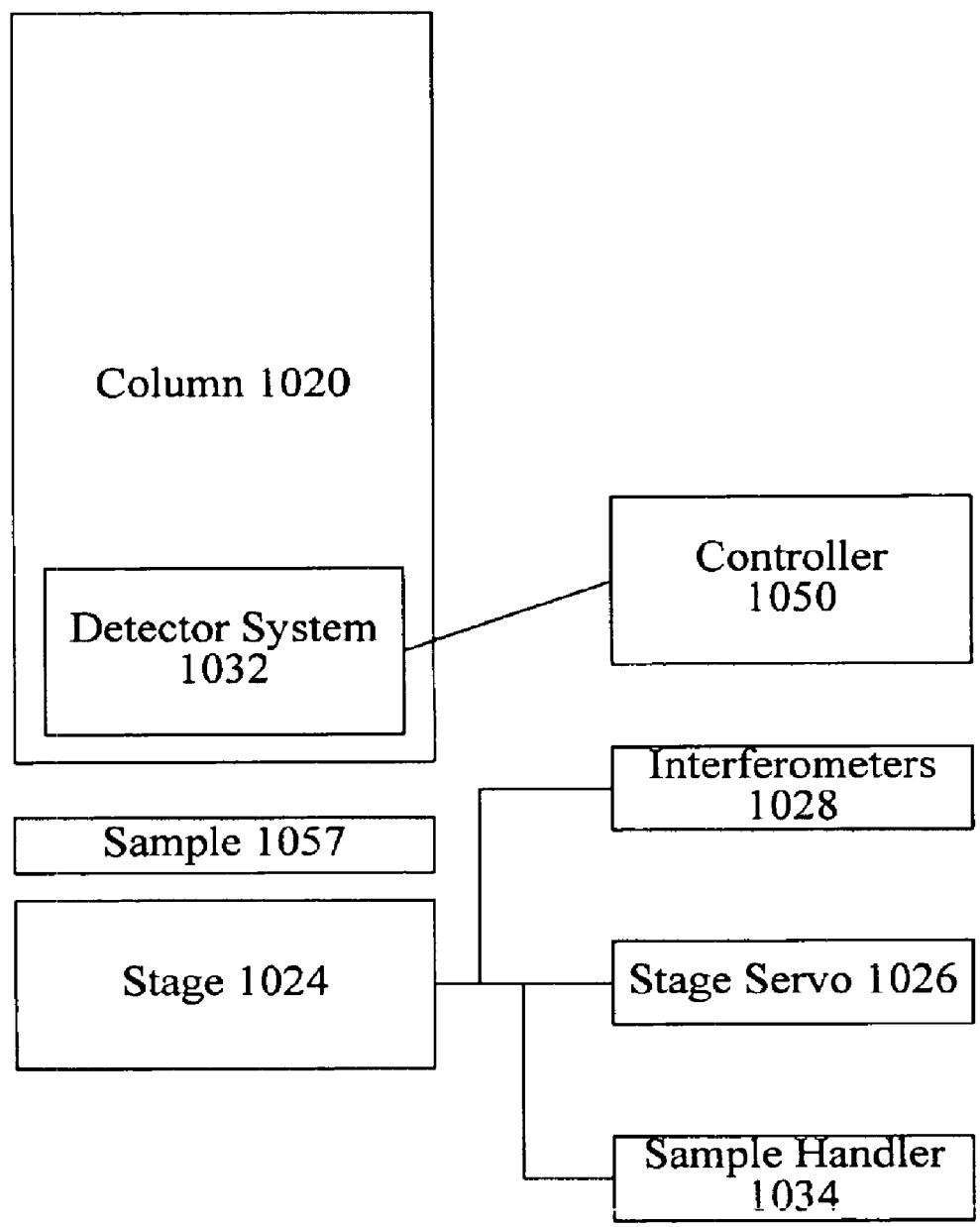
FIG. 9 is a diagrammatic representation of a scanning electron microscope (SEM) system in which the techniques of the present invention may be implemented.

FIG. 9 is a diagrammatic representation of a scanning electron microscope (SEM) system in which the techniques of the present invention may be implemented. The detail in FIG. 9 is provided for illustrative purposes. One skilled in the art would understand that variations to the system shown in FIG. 9 fall within the scope of the present invention. For example, FIG. 9 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 can be configured to have six degrees of freedom including movement and rotation along the x-axis, y-axis, and z-axis. In a preferred embodiment, the stage 1024 is aligned relative to the particle beam 1020 so that the x-directional motion of the stage is corresponds to an axis that is perpendicular to a longitudinal axis of inspected conductive lines. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. According to a preferred embodiment, the stage 1024 is grounded to thereby ground the substrate and any structure tied to the substrate (e.g., grounded test structure conductive lines) to allow voltage contrast between the floating and grounded structures as the result of scanning the targeted features.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the critical area determination and yield prediction techniques of the present invention. The controller may also be configured to correlate the coordinates of the electron beam with respect to the sample with coordinates on the sample to thereby determine, for example, a location of a determined electrical defect. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples, reference images, defect classification and position data, test structure characteristics (e.g., line width and spacing values), critical boundary information, critical area or radius values, and yield results, as well as values for particular operating parameters of the inspection system.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of for determining a critical area of at least a portion of a design layout, the design layout comprising design shapes, the design shapes comprising design shape artifacts, the method comprising:
   determining at least one critical inner boundary based on at least one design shape artifact of at least one design shape;
   determining at least one critical outer boundary based on at least one design shape artifact of at least one design shape; and
   based on the at least one critical inner boundary and the at least one critical outer boundary, determining the critical area for a particular defect type,
   wherein the critical outer boundary is located along a midline between two adjacent design shapes and the critical inner boundary is located along a midline between a pair of outer boundaries.

2. A method as recited in claim 1, wherein the design shapes can be any polygon shape.

3. A method as recited in claim 1, wherein the particular type of defect is a short type defect.

4. A method as recited in claim 1, wherein the particular type of defect is an open type defect.

5. A method as recited in claim 1, wherein determining the at least one critical inner and outer boundaries comprises:
   for each vertex of a feature, determining and adding a midpoint of a line from such feature to a closest feature to a midpoint list and;
   merging the midpoint list into a plurality of critical inner and outer boundaries.

6. A method as recited in claim 5, wherein determining the critical area comprises:
   dividing the design layout into a plurality of simple regions based on the determined inner and outer boundaries;
   determining a probability of fail curve for each simple region;
   summing the probability of fail curves for the simple regions, weighted by an area size of the each simple region to obtain a total probability of fail curve;
   providing a defect size distribution curve; and
   defining the critical area as an integration of the total probability of fail curve convoluted with the defect size distribution curve.

7. A method as recited in claim 1, wherein determining the critical inner and outer boundaries and determining the critical area are performed without iteration of a design shape artifact's position or a defect size of a defect having the particular defect type.

8. A computer program product for determining a critical area of at least a portion of a design layout, the design layout comprising design shapes, the design shapes comprising design shape artifacts, the computer program product comprising:
   at least one computer readable medium;
   computer program instructions stored within the at least one computer readable product operable to:
   determine at least one critical inner boundary based on at least one design shape artifact of at least one design shape;
   determine at least one critical outer boundary based on at least one design shape artifact of at least one design shape, wherein the critical outer boundary is located along a midline between two adjacent design shapes and the critical inner boundary is located along a midline between a pair of outer boundaries; and
   based on the at least one critical inner boundary and the at least one critical outer boundary, determine the critical area for a particular defect type.

9. A computer program product as recited in claim 8, wherein determining the at least one critical inner and outer boundaries comprises:
   for each vertex of a feature, determining and adding a midpoint of a line from such feature to a closest feature to a midpoint list and;
   merging the midpoint list into a plurality of critical inner and outer boundaries.

10. A computer program product as recited in claim 9, wherein determining the critical area comprises:
    dividing the design layout into a plurality of simple regions based on the determined inner and outer boundaries;
    determining a probability of fail curve for each simple region;
    summing the probability of fail curves for the simple regions, weighted by an area size of the each simple region to obtain a total probability of fail curve;
    providing a defect size distribution curve; and
    defining the critical area as an integration of the total probability of fail curve convoluted with the defect size distribution curve.

11. A computer program product as recited in claim 8, wherein determining the critical inner and outer boundaries and determining the critical area are performed without iteration of a design shape artifact's position or a defect size of a defect having the particular defect type.

12. An inspection system for determining a critical area of at least a portion of a design layout, the design layout comprising design shapes, the design shapes comprising design shape artifacts, the system comprising:
    beam generator for generating an electron beam towards a semiconductor device or test structure;
    a detector for detecting secondary and/or backscattered electrons from the semiconductor device or test structure and generating a detected signal, the secondary or backscattered electrons being in response to the generated electron beam; and
    a processor arranged to:
    determine at least one critical inner boundary based on at least one design shape artifact of at least one design shape;
    determine at least one critical outer boundary based on at least one design shape artifact of at least one design shape, wherein the critical outer boundary is located along a midline between two adjacent design shapes and the critical inner boundary is located along a midline between a pair of outer boundaries;
    based on the at least one critical inner boundary and the at least one critical outer boundary, determine the critical area for a particular defect type;
    cause the beam generator and detector to direct an incident electron beam onto a plurality of test structures formed from the design layout to thereby cause the detector to generate a plurality of detected signals, the test structures being disposed on a product wafer having a plurality of semiconductor product devices;
    determine a defect density for each test structure based on the detected signals; and calculate yield of the product wafer based on the determined defect density and calculated critical area of each test structure.

13. An inspection system as recited in claim 12, wherein the design shapes include a nonrectangular shape.

14. An inspection system as recited in claim 12, wherein the particular type of defect is a short type defect.

15. An inspection system as recited in claim 12, wherein the particular type of defect is an open type defect.

16. An inspection system as recited in claim 12, wherein determining the at least one critical inner and outer boundaries comprises:

for each vertex of a feature, determining and adding a midpoint of a line from such feature to a closest feature to a midpoint list and;

merging the midpoint list into a plurality of critical inner and outer boundaries.

17. An inspection system as recited in claim 16, wherein determining the critical area comprises:

dividing the design layout into a plurality of simple regions based on the determined inner and outer boundaries;

determining a probability of fail curve for each simple region;

summing the probability of fail curves for the simple regions, weighted by an area size of the each simple region to obtain a total probability of fail curve;

providing a defect size distribution curve; and defining the critical area as an integration of the total probability of fail curve convoluted with the defect size distribution curve.

18. An inspection system as recited in claim 12, wherein determining the critical inner and outer boundaries and determining the critical area are performed without iteration of a design shape artifact's position or a defect size of a defect having the particular defect type.

* * * * *